United States Patent
Possel-Doelken et al.

(10) Patent No.: US 10,178,795 B2
(45) Date of Patent: Jan. 8, 2019

(54) SYSTEM FOR FITTING COMPONENTS ON CARRIER RAILS IN AN ORDER-SPECIFIC MANNER

(71) Applicant: Phoenix Contact GmbH & Co. KG, Blomberg (DE)

(72) Inventors: Frank Possel-Doelken, Detmold (DE); Joerg Oblotzki, Bad Salzuflen (DE)

(73) Assignee: PHOENIX CONTACT GMBH & CO. KG, Blomberg (DE)

( * ) Notice: Subject to any disclaimer, the term of this patent is extended or adjusted under 35 U.S.C. 154(b) by 42 days.

(21) Appl. No.: 15/129,423

(22) PCT Filed: Mar. 31, 2015

(86) PCT No.: PCT/EP2015/057037
§ 371 (c)(1),
(2) Date: Sep. 27, 2016

(87) PCT Pub. No.: WO2015/150389
PCT Pub. Date: Oct. 8, 2015

(65) Prior Publication Data
US 2017/0118864 A1 Apr. 27, 2017

(30) Foreign Application Priority Data
Apr. 3, 2014 (DE) .......... 10 2014 104 728

(51) Int. Cl.
*H05K 7/18* (2006.01)
*H01R 9/26* (2006.01)
(Continued)

(52) U.S. Cl.
CPC ........... *H05K 7/183* (2013.01); *H01R 9/2683* (2013.01); *H01R 43/00* (2013.01); *H05K 7/1467* (2013.01)

(58) Field of Classification Search
CPC ....... H05K 7/183; H01R 9/2683; H01R 43/00
See application file for complete search history.

(56) References Cited

U.S. PATENT DOCUMENTS

2007/0057789 A1* 3/2007 Hamerly ................. G06Q 10/06
340/572.1
2012/0031964 A1* 2/2012 Thielmann ........... H05K 7/1421
235/375
(Continued)

FOREIGN PATENT DOCUMENTS

CN 101268497 A 9/2008
CN 102326466 A 1/2012
(Continued)

*Primary Examiner* — Hoa C Nguyen
*Assistant Examiner* — Keith DePew
(74) *Attorney, Agent, or Firm* — Leydig, Voit & Mayer, Ltd.

(57) ABSTRACT

An installation for equipping DIN rails, according to an order, with components, including at least one of terminal blocks, electrical devices, and end holders, that are intended to be subsequently installed in switch cabinets, includes at least one main cell. The at least one main cell includes at least one supply unit for supplying the components to be fitted; at least one supply unit for supplying DIN rails, the DIN rail being equipped with the components in the main cell; and a writing, device designed to wirelessly transmit data, in order for said data to be saved, to a memory unit that is arranged on each DIN rail equipped with components and has an integrated wireless communications interface, the data containing order-specific information.

7 Claims, 5 Drawing Sheets

(51) Int. Cl.
*H01R 43/00* (2006.01)
*H05K 7/14* (2006.01)

(56) References Cited

U.S. PATENT DOCUMENTS

| | | | |
|---|---|---|---|
| 2013/0205566 A1* | 8/2013 | Ruppert | H01R 9/26 29/428 |
| 2014/0241833 A1 | 8/2014 | Grossmann | |
| 2015/0229045 A1* | 8/2015 | Falk | H01R 9/2608 439/121 |
| 2015/0289394 A1* | 10/2015 | Kalhoff | H04B 5/0012 361/752 |
| 2016/0321486 A1* | 11/2016 | Chhuor | H05K 7/1488 |
| 2017/0082460 A1* | 3/2017 | Dias | G01D 5/16 |

FOREIGN PATENT DOCUMENTS

| | | |
|---|---|---|
| CN | 103125050 A | 5/2013 |
| DE | 3929721 A1 | 3/1991 |
| DE | 102006023812 A1 | 11/2007 |
| DE | 102009017999 A1 | 5/2010 |
| DE | 102010047369 A1 | 4/2012 |
| FR | 2951591 A1 | 4/2011 |
| WO | WO 2009091888 A1 | 7/2009 |
| WO | WO 2010094459 A1 | 8/2010 |
| WO | WO 2013056850 A1 | 4/2013 |

\* cited by examiner

SYSTEM FOR FITTING COMPONENTS ON CARRIER RAILS IN AN ORDER-SPECIFIC MANNER

CROSS-REFERENCE TO PRIOR APPLICATIONS

This application is a U.S. National Phase application under 35 U.S.C. § 371 of International Application No. PCT/EP2015/057037, filed on Mar. 31, 2015, and claims benefit to German Patent Application No. DE 10 2014 104 728.1, filed on Apr. 3, 2014. The International Application was published in German on Oct. 8, 2015 as WO 2015/150389 A1 under PCT Article 21(2).

FIELD

The invention relates to an installation for equipping DIN rails, according to an order, with components which are intended to be subsequently installed in switch cabinets. The components with which the DIN rails are equipped are in particular terminal blocks, electrical devices or end holders. The invention also relates to an equipped DIN rail and to a method for equipping DIN rails according to an order.

BACKGROUND

A DIN rail equipped with terminal blocks as components is known, for example, from DE 39 29 721 A1. In addition to the terminal blocks, end holders are arranged on the ends of the DIN rail and are used to support the end faces of terminal blocks lined up on the DIN rail and to prevent them from slipping on the DIN rail.

Switch cabinets in which the DIN rails are usually installed comprise a plurality of rows arranged next to one another horizontally and/or vertically for receiving the DIN rails.

In this case, the DIN rails cannot be equipped with the components until the DIN rails are installed in the switch cabinet.

It is also common to equip the DIN rails with the components according to an order before they are installed in the switch cabinets. In this respect, "according to an order" means that the rails are equipped in accordance with a specific order that specifies which components (e.g. terminal blocks, electrical devices, end holders) are to be arranged on the DIN rail, how many of these components are to be arranged and in what order. In the process, the order data can optionally also contain information on how the individual components on the DIN rail are to be labeled or provided with labels or the like. The fully equipped (pre-assembled) DIN rails are then installed in the switch cabinet either in the switch cabinet manufacturing facility or on site by the switch cabinet operator at the location of the switch cabinet. Since the DIN rails are equipped according to an order and are thus different, the equipped DIN rail also has to undergo further processing, e.g. component labeling, as specified by the order. Owing to the large differences between the pre-equipped DIN rails, the equipped DIN rails also have to be installed in the switch cabinets according to the order. If the pre-equipped DIN rail is assigned incorrectly, errors occur during the further processing and the DIN rail is installed in the incorrect switch cabinet or at the incorrect position in the switch cabinet.

DE 10 2010 047 369 A1 discloses an installation for equipping DIN rails with components.

SUMMARY

An installation for equipping DIN rails, according to an order, with components, including at least one of terminal blocks, electrical devices or end holders, that are intended to be subsequently installed in switch cabinets, includes at least one main cell. The at least one main cell includes at least one first supply unit for supplying the components; at least one second supply unit for supplying therein DIN rails with the components; and a writing device configured to wirelessly transmit data, for saving the data, to a respective memory unit arranged on each DIN rail equipped with the components and having an integrated wireless communications interface, the data containing order-specific information.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following.

DETAILED DESCRIPTION

Figure 1:
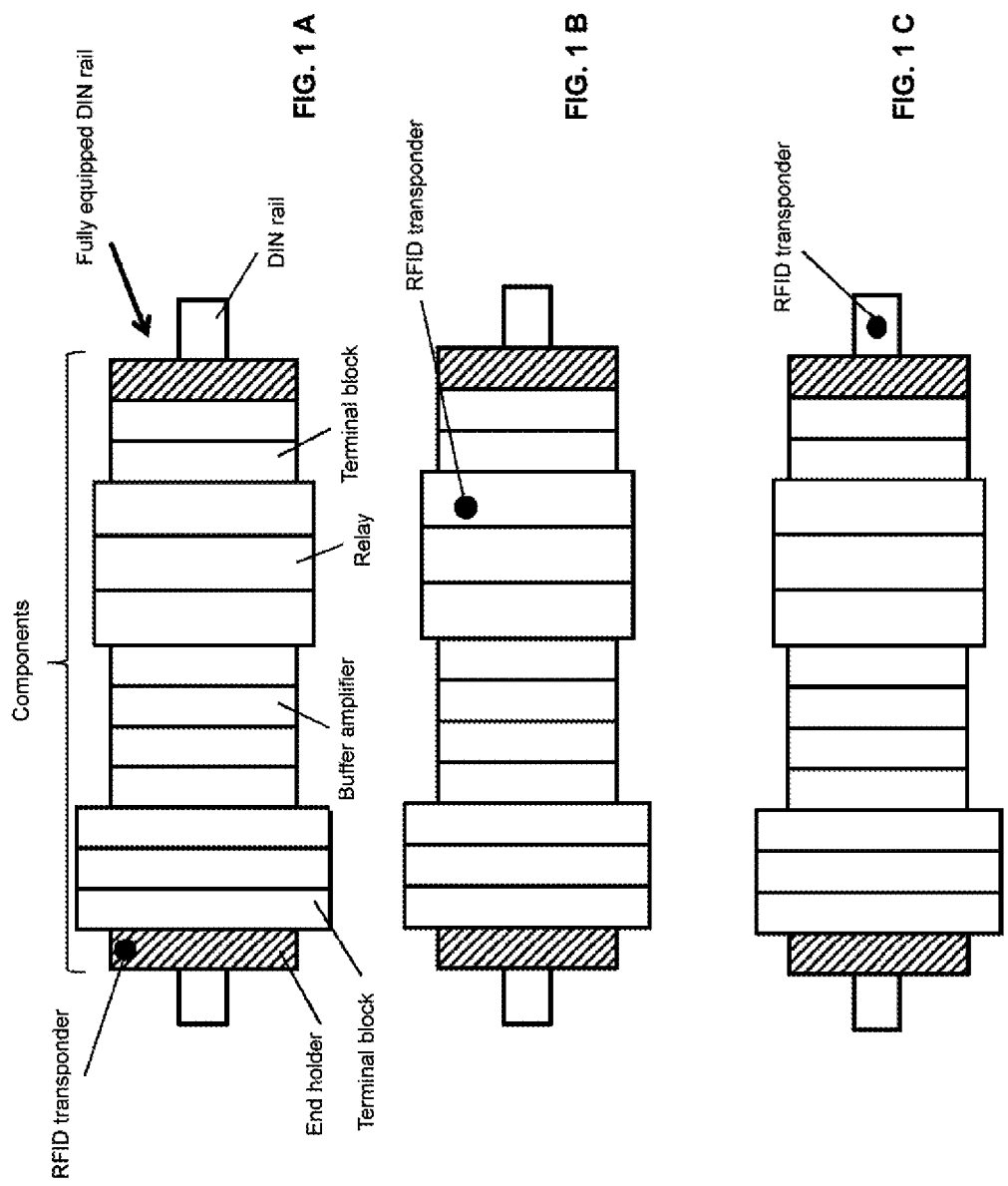
FIG. 1A shows a DIN rail equipped with components and comprising an RFID transponder integrated in an end holder.
FIG. 1B shows a DIN rail equipped with components as in FIG. 1A, although with the RFID transponder integrated in a relay component.
FIG. 1C shows a DIN rail equipped with components as in FIG. 1A, although with the RFID transponder integrated in the DIN rail itself.

The installation for equipping DIN rails, according to an order, with components that are intended to be subsequently installed in switch cabinets comprises a main cell, in which there are arranged at least one supply unit for supplying the components to be fitted and at least one supply unit for supplying DIN rails, the DIN rail being equipped with the components in the main cell. According to the invention, the main cell comprises a writing device designed to wirelessly transmit data, in order for said data to be saved, to a memory unit that is arranged on each DIN rail equipped with components and has an integrated wireless communications interface, the data containing order-specific information.

The components with which the DIN rails are equipped are in particular terminal blocks, electrical devices (e.g. buffer amplifiers, relays, etc.) and end holders. The components comprise suitable means for locking onto the DIN rail. The DIN rails themselves are preferably formed as "top-hat rails".

The order-specific data stored in the memory unit arranged on the fully equipped DIN rail can be read out during the further processing or handling of the equipped DIN rail, it then being possible to carry out the further processing in a simple manner on the basis of the order-specific data read out. The equipped DIN rails can also be installed in the switch cabinets in a simple manner on the basis of the easy-to-read data, without having to draft and analyze complex written order-related documents.

Since the memory unit has a wireless communications interface, the order-specific data can be read out in a simple and contactless manner, and can even be read out by appropriate wireless reading devices if the view is obstructed. Unlike printed data, the data that is stored and can be electronically and wirelessly read out again according to the invention has the advantage that there is no possibility of damage, e.g. by rubbing, that leads to illegible text.

In an advantageous embodiment, the order-specific data only contain an order number instead of all the order information, order numbers and related order information being stored in a control system of the installation and/or in a local controller of a further processing cell. The order number read out from the memory unit is then forwarded to the control system and/or to the local controller in order to obtain the associated order information required for processing in the further processing cell. Less memory space is required to store an order number than to store comprehensive order information. Thus the actual memory of the memory unit according to the invention can accordingly be small and thus cost-effective. In addition, a comparatively short order number that only includes a small amount of data can be stored and read out very quickly, and so no adverse delays occur in this case.

In another advantageous embodiment, the order-specific data contain, in addition or alternatively to the aforementioned information, a location ID for identifying the switch cabinet in which the equipped DIN rail is to be installed, the location ID in particular also including information on the installation position of the equipped DIN rail within the switch cabinet. A fitter can then read out the location ID in a simple manner using a mobile reading device, and can fit the equipped DIN rail in the correct switch cabinet and at the correct position therein without consulting additional documents.

FIG. 1A to 1C each show a DIN rail equipped with components. In the example shown, the components lined up one after the other are terminal blocks, buffer amplifiers and relays. Each of the components comprises a separate housing, by means of which the component is locked onto the DIN rail by suitable means. An end holder is arranged on each end as a supporting component. The equipped DIN rail now comprises a memory unit having an integrated wireless radio communications interface used for saving order-specific data relating to the equipped DIN rail.

Preferably, an RFID transponder (radio frequency identification) is used as the memory unit having the integrated wireless communications interface. A non-volatile memory, e.g. EEPROM, is preferably used as the memory because the data then remain stored even when there is no power supply, and so it is possible to use cost-effective passive RFID transponders, which do not consume any power but rather draw their energy from the radio signals from the corresponding writing and reading devices. If only an order number and a location ID are stored, significantly less than 1 Kbit of memory space is all that is required, and this likewise enables the use of cost-effective RFID transponders.

However, the invention is not limited to the use of RFID transponders. Other wireless communications interfaces can also be used instead, in particular those operating according to the NFC standard (near field communication). Where the embodiments described below mention an RFID transponder, the embodiments in question are explicitly not limited to the use of RFID transponders, but rather memory units having other wireless communications interfaces can also be used in these embodiments.

The memory unit having the wireless communications interface (the RFID transponder in FIG. 1A to 1C) can be integrated in a component or in the DIN rail itself. In the embodiment according to FIG. 1A, the RFID transponder is integrated in an end holder. In the embodiment according to FIG. 1B, the RFID transponder is integrated in a relay component. According to the embodiment shown in FIG. 1C, the RFID transponder is integrated in the DIN rail itself. In this case, the RFID transponder is arranged captively in each embodiment. When integrating the RFID transponder in the components (end holders, electrical devices such as relays, buffer amplifiers, terminal blocks), the RFID transponder is preferably arranged in the housings of these components. For this purpose, the housings comprise suitable recesses for captively holding the RFID transponder. In this case, the RFID transponders can for example be pressed or glued in. In plastics housings, the RFID transponders can also be embedded in the housing when the housing is produced using plastics injection moulding.

Figure 2:
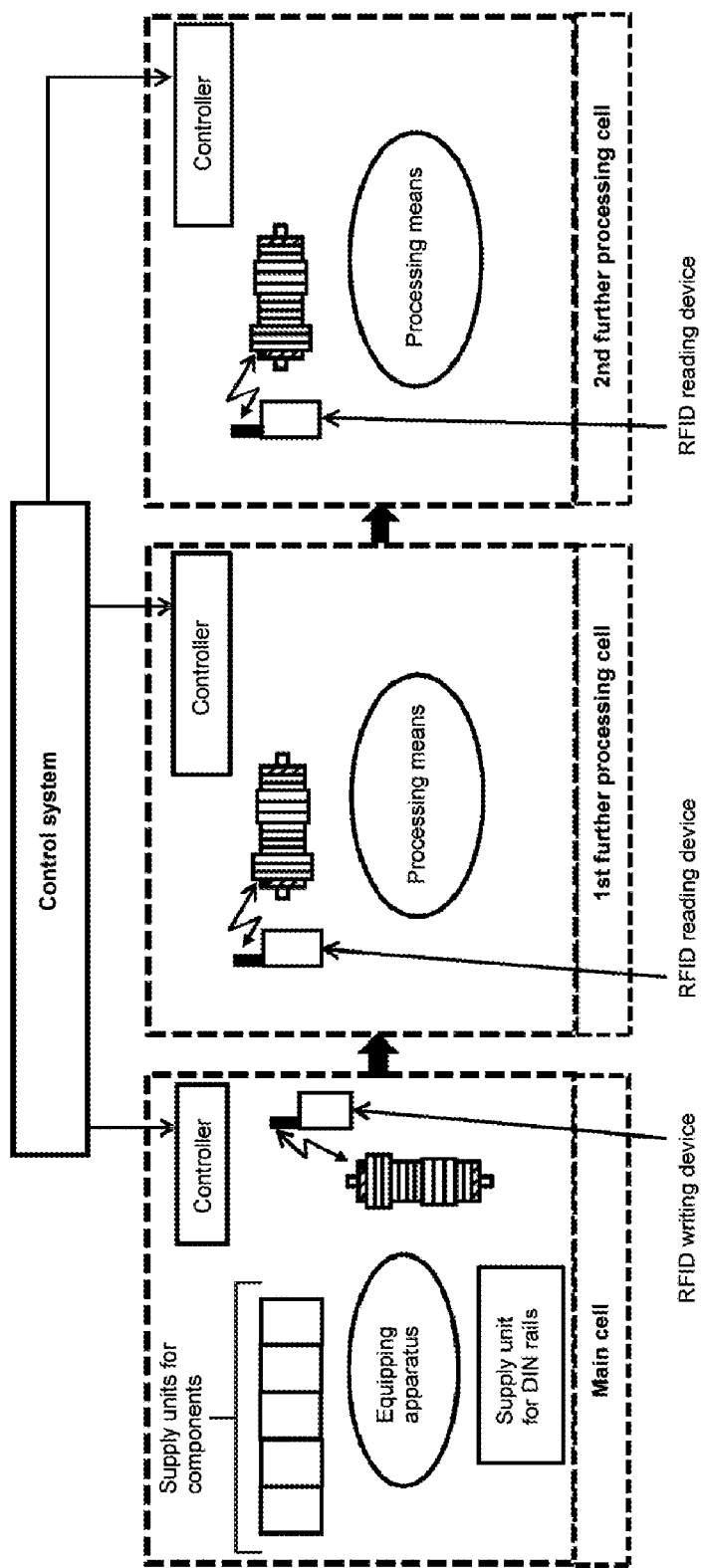
FIG. 2 is a schematic overview of the installation according to the invention, consisting of a main cell and two subsequent cells for further processing.

FIG. 2 is a schematic overview of the installation according to the invention, consisting of a main cell and two subsequent cells for further processing. It can be seen from this figure that the DIN rails equipped with components in the main cell undergo further processing steps in the subsequent cells. The main cell comprises five supply units for supplying the components to be fitted, the first supply unit being used for supplying terminal blocks, the second supply unit for supplying relays, the third supply unit for supplying buffer amplifiers, the fourth supply unit for supplying end holders without an RFID transponder, and the fifth supply unit for supplying end holders comprising an RFID transponder.

In addition, the main cell comprises a supply unit for supplying DIN rails. Within the main cell, the DIN rails are now equipped with the components according to the order. In the process, it is determined according to the specific order which types of components (terminal blocks, electrical devices, end holders) are to be arranged on the DIN rail, the number and type of these components, and in which order they are to be arranged. Accordingly, to equip the DIN rails, the components are removed from the respective supply units successively and locked onto the DIN rail in sequence. As the final component, the end holder having the RFID transponder is locked onto the end. The DIN rail is thus fully equipped according to the specific order.

The DIN rail can be equipped with the components completely automatically, semi-automatically or completely manually. When the rails are to be equipped completely automatically or semi-automatically, the main cell comprises an equipping apparatus.

According to the invention, the main cell comprises a writing device in the form of an RFID writing device which, in a final processing step, transmits the order-specific data to the RFID transponder of the equipped DIN rail in order for said data to be saved. The RFID writing device receives the order-specific data directly from the control system of the installation or indirectly by means of a local controller of the main cell, which controller is in turn connected to the control system. At the same time, the main cell can also comprise an RFID reading device or a combined RFID writing and reading device. In this way, for example, the written data can also be read out again for inspection purposes.

In the subsequent cells, in which the equipped DIN rail is processed further, the order-specific data are then read out from the RFID transponder by means of an RFID reading device. The further processing is then carried out in the relevant cell on the basis of the order-specific data read out. In addition to the RFID reading device, the further processing cells can also comprise an RFID writing device or a combined RFID writing and reading device. In this way, for example, information on successful further processing can be written to the RFID transponder.

The order-specific information can contain the following information:
the number of components on the DIN rail,
the type of components,
the configuration of the components,
the dimensions of the components,
print data for labels to be attached to the components once they have been fitted,
images of the equipped DIN rails having the printed labels on the components,
total width of the components lined up next to one another,
etc.

Instead of storing all the aforementioned information in the RFID transponders, it is advantageous as a final processing step in the main cell to only store an order number in the RFID transponder. In this case, order numbers and the associated order information are stored in the control system of the installation and/or in a local controller of a further processing cell. The order number read out from the memory unit is then forwarded to the control system and/or to the local controller in order to obtain the associated order information required for processing in the further processing cell.

In an alternative embodiment, as a final processing step in the main cell, a location ID for identifying the switch cabinet in which the equipped DIN rail is to be installed is stored in the RFID transponder, in addition to the aforementioned information. The location ID can also be stored as the only order-specific data.

The equipped DIN rails are conveyed from the main call to the first further processing cell and between further processing cells either manually or automatically by means of suitable conveying means. The conveying means are, for example, roller conveyors on which the equipped DIN rail rests in order to be conveyed, the equipped DIN rail having the RFID transponder being conveyed to a reading position of the next further processing cell, where the RFID transponder can be read by the RFID reading device. In the process, it is advantageous for the purpose of reading the RFID transponder to arrange said transponder in an end holder since the end holders are always on the front or rear end of the equipped DIN rails, and so the position of the RFID transponder on the equipped DIN rails is determined thereby in practically every case. It is therefore simpler to move the equipped DIN rail into the appropriate reading position. However, it is also possible to read the RFID transponder as the equipped DIN rail is conveyed past the reading device, more or less as it passes.

Equipping the DIN rails according to the order means that the DIN rails are equipped with different components, apart from the end holders. For example, one DIN rail can be equipped with only terminal blocks and another only with buffer amplifiers. However, the two DIN rails comprise end holders, which generally also have the same design. Therefore, since they are practically universal components, end holders are especially suitable as supports for the RFID transponders. Using a supply of end holders having integrated RFID transponders thus makes it possible to fit DIN rails equipped with different components.

Moreover, using end holders as supports for the RFID transponders is advantageous in that the RFID transponders are simpler to read when the equipped DIN rails are installed in the switch cabinet, since the end position is clearly defined in this case too, and generally there is sufficient space from the switch cabinet walls on both sides of the end holders to position an optionally mobile RFID reading device next to the end holders.

Figure 3:
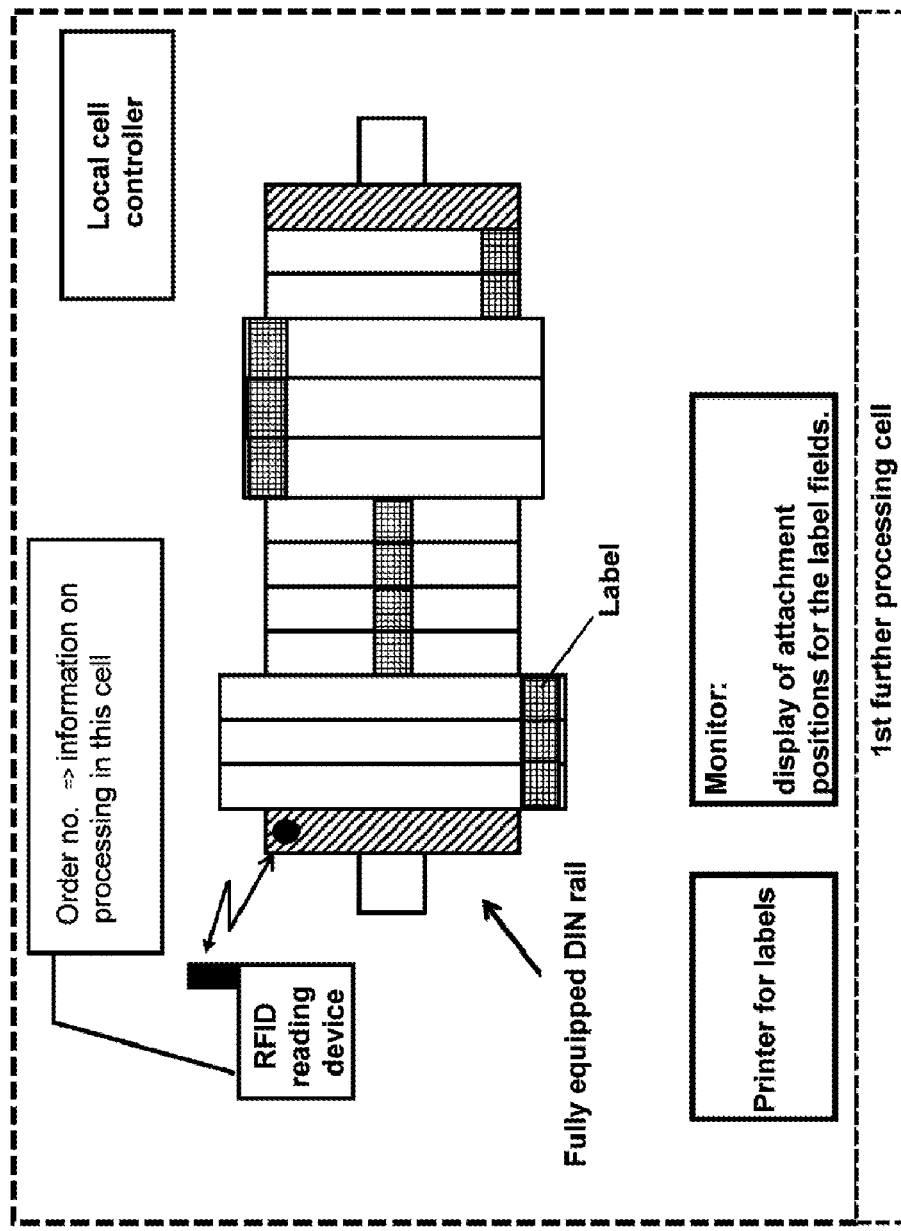
FIG. 3 is a schematic view of a first further processing cell.

FIG. 3 shows a first further processing cell in more detail. In this further processing cell, order-specific labels are printed for the components of the DIN rail. The labels can be applied manually or automatically. On the basis of the order number read out from the RFID transponder, the print data for the labels to be applied to the components can then be retrieved from the control system and the labels printed using a printer. As an assembly aid when manually applying the labels, the attachment position of the label fields is shown on a monitor. For this purpose, an image of the equipped DIN rail having the printed labels on the components is shown as a template.

Figure 4:
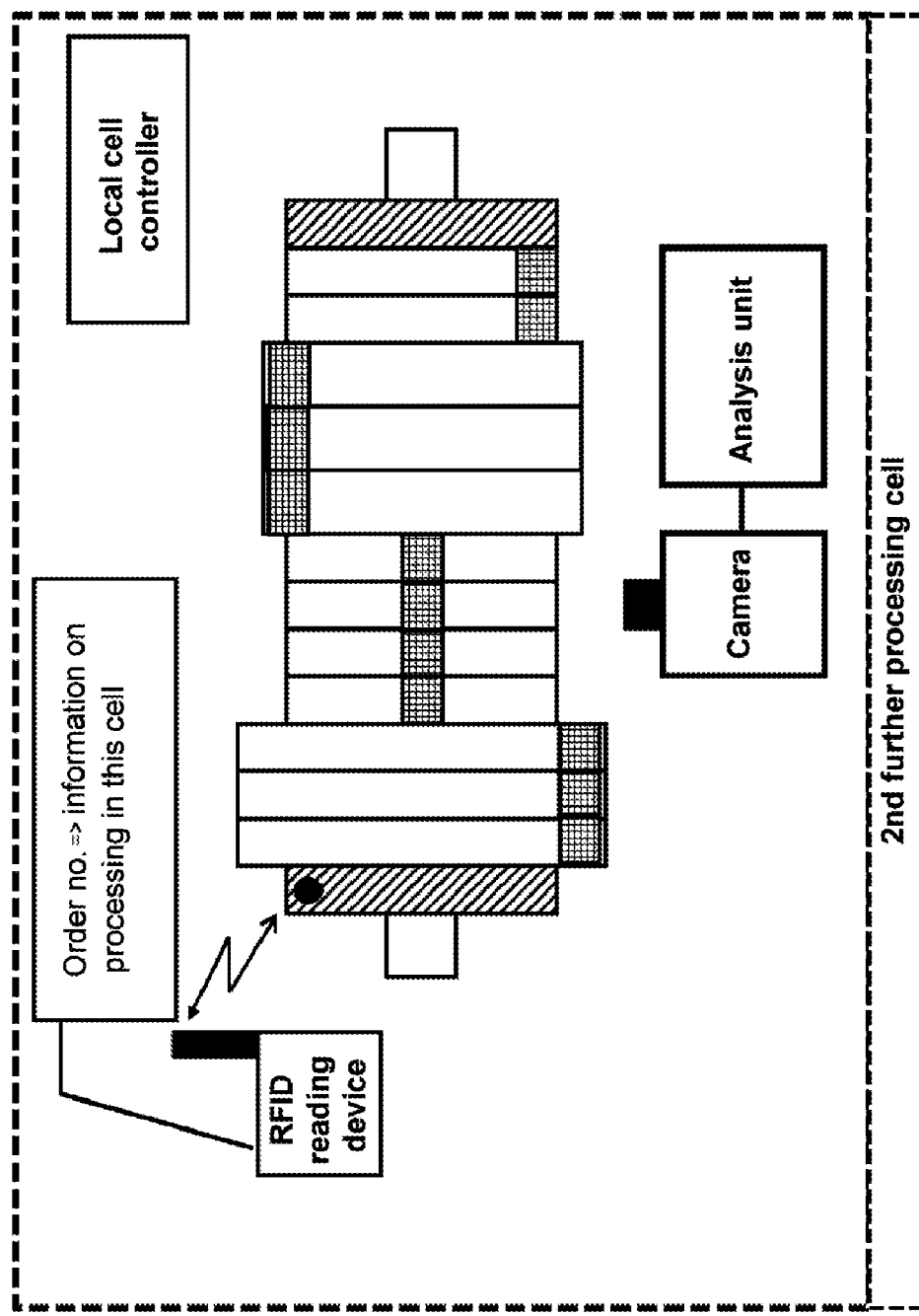
FIG. 4 is a schematic view of a second further processing cell.

FIG. 4 shows a further, second processing cell in more detail. In this further processing cell, the DIN rail that has been equipped and printed on according to an order is inspected visually using a camera. In the process, an image of the equipped and printed DIN rail is taken by a camera. By means of digital image processing, it can be checked, by comparison against the order information, whether the labeling is correct, what the total width of the components lined up next to one another is, and whether the rail has been equipped fully. The order information required to do so is determined by reading the order number from the RFID transponder.

Figure 5:
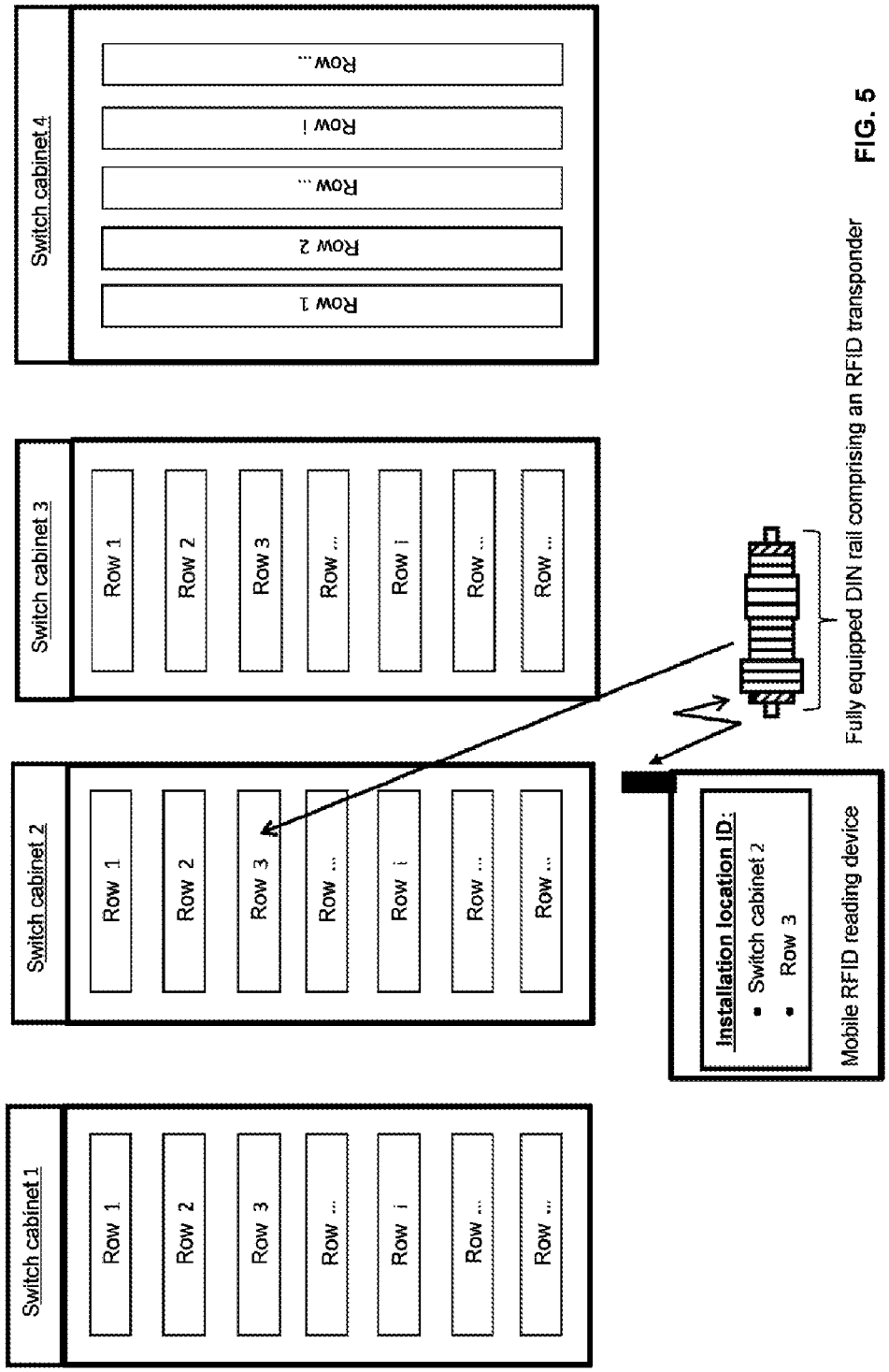
FIG. 5 is a schematic view of a series of switch cabinets and a mobile RFID reading device for reading the memory unit arranged on the equipped DIN rail.

FIG. 5 shows a plurality of switch cabinets, each comprising a plurality of rows for possible installation positions for DIN rails equipped with components. This is a typical situation for a fitter who is supposed to install equipped DIN rails in switch cabinets. By means of a mobile RFID reading device, the fitter can now read out the location ID from the RFID transponder of the equipped DIN rail in a simple manner. In the process, the location ID consisting of the switch cabinet number and the installation row can be displayed on a screen or communicated to the fitter via voice output. The fitter is thus notified in a simple and reliable manner of the switch cabinet and row within the switch cabinet in which each equipped DIN rail should be installed. It is also advantageous to read the RFID transponder when the equipped DIN rails are already installed in the switch cabinet. In this way, for example, the correct installation position of an equipped DIN rail can be checked. It is thus also possible to retrieve the order information for an equipped DIN rail in a simple manner, thus making it easier to replace individual components on the DIN rail or to completely change the equipped DIN rail.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. An installation for equipping DIN rails, according to an order, with components, including at least one of terminal blocks, electrical devices, or end holders, that are intended to be subsequently installed in switch cabinets, the installation comprising:
at least one main cell comprising:
at least one first supply unit configured to supply the components;
at least one second supply unit configured to supply therein DIN rails with the components; and
a writing device configured to wirelessly transmit data, for saving the data, to a respective memory unit arranged on each DIN rail equipped with the components and having an integrated wireless communications interface, the data containing order-specific information, and
at least one additional cell, to which the fully equipped DIN rails are fed for further processing, the additional cell comprising a reading device configured to wirelessly read the memory unit, the fully equipped DIN rails being processed further in this cell on the basis of the order-specific data read out.

2. The installation according to claim 1, wherein the at least one main cell comprises a reading device configured to wirelessly read data from the memory unit arranged on each DIN rail equipped with the components.

3. The installation according to claim 2, wherein the at least one main cell comprises a combined writing and reading device.

4. The installation according to claim 1, wherein the at least one main cell comprises an apparatus configured to automatically equip the DiN rails with the components.

5. The installation according to claim 1, wherein order numbers and associated order information are stored at least one of in a control system of the installation or in a local controller of the at least one additional cell, the order number read out from the memory unit on the equipped DIN rail being forwarded to at least one of the control system or to the local controller to obtain the associated order information.

6. A method for equipping DIN rails, according to an order, with components that are intended to be subsequently installed in switch cabinets, the method comprising:
providing, in at least one main cell, a supply of components to be fitted on the DIN rails;
providing, in the at least one main cell, a supply of DIN rails;
fully equipping, in the at least one main cell, a first of the DIN rails with components from the components to be fitted;
wirelessly writing, in the at least one main cell, data to a memory unit arranged on the first DIN rail that is fully equipped with components, the data containing order-specific information;
feeding the fully equipped first DIN rail to at least one additional cell containing a reading device that wirelessly reads the memory unit; and
further processing the fully equipped DIN rail in the at least one additional cell on the basis of the order-specific data read out.

7. The method according to claim 6, wherein the data include at least one of at least one order number or a location ID for identifying the switch cabinet in which the fully equipped DIN rail is to be installed.

* * * * *